(12) United States Patent
Koo (10) Patent No.: US 7,990,051 B2
(45) Date of Patent: Aug. 2, 2011

(54) ORGANIC LIGHT EMITTING DEVICE

(75) Inventor: Hongmo Koo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 12/513,887

(22) PCT Filed: Jul. 24, 2007

(86) PCT No.: PCT/KR2007/003555
§ 371 (c)(1),
(2), (4) Date: May 7, 2009

(87) PCT Pub. No.: WO2008/056868
PCT Pub. Date: May 15, 2008

(65) Prior Publication Data
US 2010/0019668 A1    Jan. 28, 2010

(30) Foreign Application Priority Data

Nov. 8, 2006 (KR) .......... 10-2006-0110216
Nov. 8, 2006 (KR) .......... 10-2006-0110217

(51) Int. Cl.
*H01J 1/62* (2006.01)
(52) U.S. Cl. ............................ 313/504; 313/506
(58) Field of Classification Search ......... 313/498, 313/504, 506
See application file for complete search history.

(56) References Cited

U.S. PATENT DOCUMENTS
6,841,803 B2   1/2005   Aizawa et al.

FOREIGN PATENT DOCUMENTS
KR   10-2006-0033134 A   4/2006

*Primary Examiner* — Vip Patel
(74) *Attorney, Agent, or Firm* — Birch, Stewart, Kolasch & Birch, LLP

(57) ABSTRACT

An organic light emitting device includes a display panel, and a polarizer that is positioned on the display panel and includes a retarder and a polarizing film. The polarizing film includes a base layer and shielding patterns positioned inside the base layer. An area of the shielding pattern close to the display panel is larger than an area of the shielding pattern far away from the display panel. The shielding pattern is formed in a non-emitting area of the display panel.

18 Claims, 7 Drawing Sheets

ORGANIC LIGHT EMITTING DEVICE

TECHNICAL FIELD

Exemplary embodiments relate to an organic light emitting device.

BACKGROUND ART

Out of display devices, an organic light emitting device has advantages such as fast response time and low power consumption. Furthermore, because the organic light emitting device does not need a backlight unit, the organic light emitting device can be fabricated to be thin and light.

The organic light emitting device includes an emissive unit including an organic emissive layer between an anode electrode and a cathode electrode. The organic light emitting device forms an exciton, which is a hole-electron pair, by combining holes received from the anode electrode and electrons received from the cathode electrode inside the organic emissive layer, and emits light by energy generated when the exciton returns to a ground level.

DISCLOSURE OF INVENTION

Technical Problem

The organic light emitting device displays an image due to light emitted from each subpixel, and light entering from the outside is incident on a light emitting panel of the organic light emitting device. However, because the light incident on the light emitting panel interferes with light emitted from the light emitting panel, a contrast ratio of the organic light emitting device is reduced.

Technical Solution

The organic light emitting device includes a display panel, and a polarizer that is positioned on the display panel and includes a retarder and a polarizing film. The polarizing film includes a base layer and shielding patterns positioned inside the base layer. An area of the shielding pattern close to the display panel is larger than an area of the shielding pattern far away from the display panel. The shielding pattern is formed in a non-emitting area of the display panel.

Advantageous Effects

Since the organic light emitting device according to an exemplary embodiment includes the shielding patterns, light entering from the outside is shielded and the contrast ration increases. External light incident on the organic light emitting device is disappeared such that the image quality is improved.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawings.

BEST MODE FOR CARRYING OUT THE INVENTION

Reference will now be made in detail embodiments of the invention examples of which are illustrated in the accompanying drawings.

Figure 1:
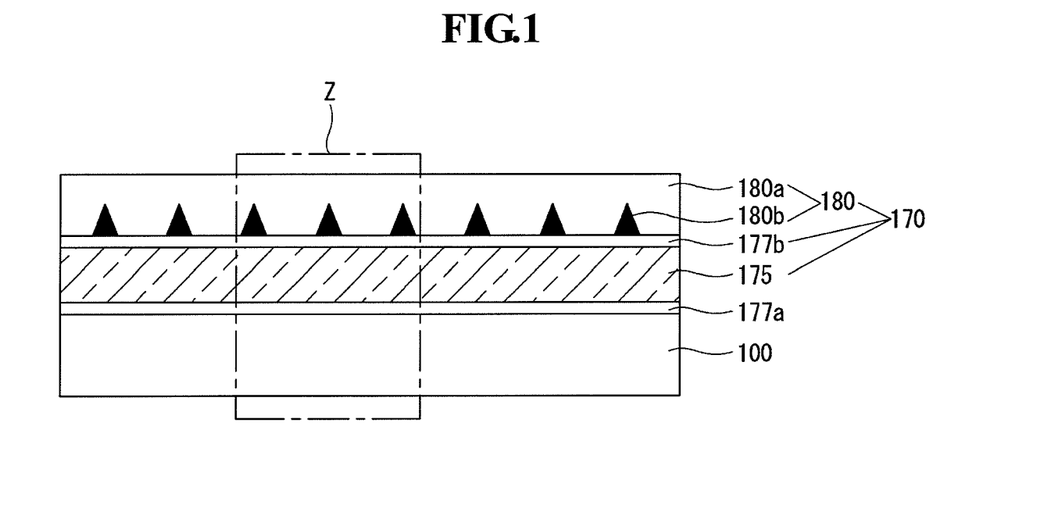
FIG. 1 is a side cross-sectional view of an organic light emitting device according to an exemplary embodiment.

FIG. 1 is a side cross-sectional view of an organic light emitting device according to an exemplary embodiment.

As illustrated in FIG. 1, an organic light emitting device according to an exemplary embodiment includes an organic light emitting panel 100, and a polarizer 170 positioned on an emitting surface of the organic light emitting panel 100.

The polarizer 170 includes a retarder 175 and a polarizing film 180 positioned on the retarder 175. The polarizing film 180 includes a base layer 180a and shielding patterns 180b. The base layer 180a may include iodine-based material or dye-based material. The shielding patterns 180 absorb or reflect light entering from the outside. The shielding patterns 180 may be shaped like a wedge. Therefore, an area of the shielding pattern 180 close to the organic light emitting panel 100 may be larger than an area of the shielding pattern 180 far away from the organic light emitting panel 100. The shielding pattern 180 may have a horn shape such as a cone and a quadrangular pyramid or a prism shape such as a cylinder and a rectangular prism.

Attaching layers 177a and 177b may be positioned between the organic light emitting panel 100 and the retarder 175 or between the retarder 175 and the polarizing film 180.

Figure 2:
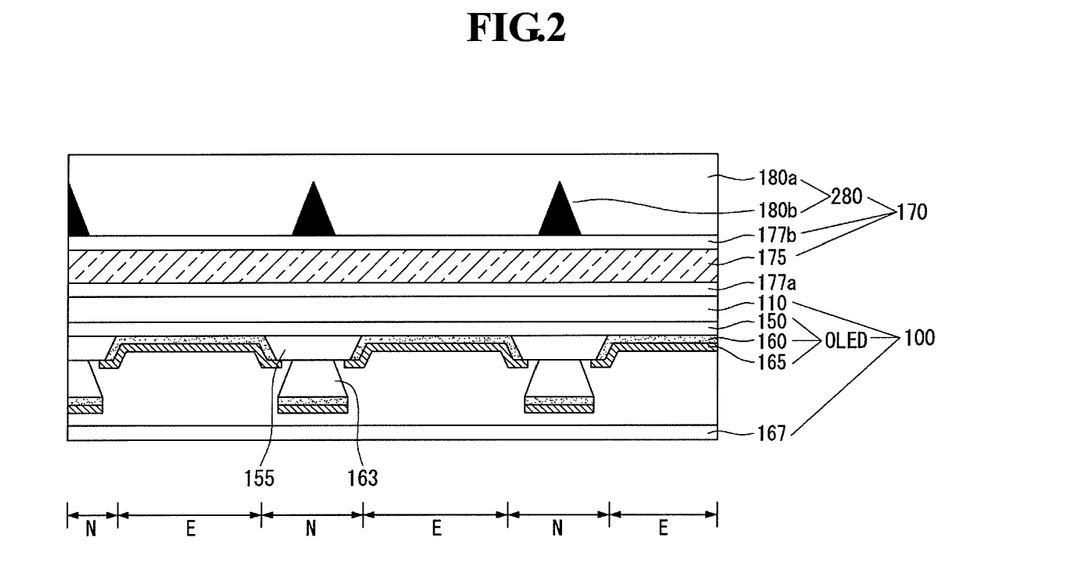
FIG. 2 is an enlarged view of a portion Z of FIG. 1.

FIG. 2 is an enlarged view of a portion Z of FIG. 1.

As illustrated in FIG. 2, a first substrate 110 is provided. The first substrate 110 may be formed of glass, plastic, or metal. A first electrode 150 is positioned on the first substrate 110. The first electrode 150 may be an anode electrode. The first electrode 150 may include a transparent conductive oxide layer such as an indium-tin-oxide (ITO) layer. A bank layer 155 is positioned on the first electrode 150 to expose a portion of the first electrode 150 and to define an emitting area. An area of the first electrode 150 exposed by the bank layer 155 is defined as an emitting area E. An area except the emitting area E is defined as a non-emitting area N. In other words, the bank layer 155 may be formed along the outside of the emitting area E, and an edge of the bank layer 155 may be inclined to have a taper shape.

A reverse trapper-shaped barrier rib 163 may be positioned on the bank layer 155. An organic emissive layer 160 is positioned on the area of the first electrode 150 exposed by the bank layer 155, and a second electrode 165 is positioned on the organic emissive layer 160. The second electrode 165 may be a cathode electrode. The second electrode 165 may be patterned by the barrier rib 163. The second electrode 165 may be formed of a material having a low work function and excellent reflectivity such as aluminum (Al), magnesium (Mg), and silver (Ag). The organic emissive layer 160 receives holes from the first electrodes 150 and electrons from the second electrode 165 to form excitons. Then, the organic light emitting device displays an image due to light generated when the exciton returns to a ground level.

The first substrate 110 on which an organic light emitting diode (OLED) is formed may be attached to a second substrate 167 to protect the organic light emitting diode (OLED) from external moisture and oxygen.

Light emitted from the organic emissive layer 160 is reflected by the second electrode 165, and then the organic emissive layer 160 emits light in a rear direction of the first substrate 110. Therefore, the organic light emitting device according to an exemplary embodiment is a bottom emissive type device.

The polarizer 170 is positioned on a rear surface of the first substrate 110. The attaching layer 177a may be positioned between the organic light emitting panel 100 and the polarizer 170.

The polarizer 170 may include the retarder 175 and the polarizing film 180 including the base layer 180a and the shielding patterns 180b.

The retarder 175 may be a quarter-wave plate. The retarder 175 retards a phase of a light wave entering from the outside or a phase of a light wave emitted from the organic light emitting panel 100 by a quarter wavelength.

The polarizing film 180 is positioned on the retarder 175. The attaching layer 177b may be positioned between the retarder 175 and the polarizing film 180.

The base layer 180a may include iodine-based material or dye-based material. More specifically, the base layer 180a may be fabricated by stretching iodine-based material or dye-based material each having a different light-absorption characteristic depending on a polarization direction determined by its molecule structure and then aligning the stretched iodine-based material or dye-based material in one direction. To achieve polarization characteristics in the entire area of visible light, the base layer 180a may include iodine-based material or two or more kinds of dichroic dye-based materials each having a different absorption area.

A maximum polarization efficient value of the base layer 180a can be adjusted to a wavelength corresponding to a maximum value in a luminosity curve of the panel 100 or a wavelength corresponding to a maximum intensity of external light wave. Transmittance and polarizability of the base layer 180a may be different from each other in red, green and blue wavelengths. For instance, transmittance of the base layer 180a may increase and polarizability of the base layer 180a may decrease in red and green wavelengths. Transmittance and polarizability of the base layer 180a can be adjusted so that light efficiency is maximized as compared with pressure voltages of red, green and blue subpixels The shielding patterns 180b are positioned inside the base layer 180a. The shielding pattern 180b may be formed at a location corresponding to the bank layer 155 positioned in the non-emitting area N. Since the emitting area E means the exposed area of the first electrode 150, that is, a contact area of the organic emissive layer 160 and the first electrode 150, the shielding patterns 180b may be formed in an inclined area of the bank layer 155.

An area of a lower portion of the shielding pattern 180b may be different from an area of an upper portion of the shielding pattern 180b. For instance, the shielding pattern 180b may have a horn shape such as a cone, a quadrangular pyramid and a triangular pyramid, a prism shape such as a cylinder and a rectangular prism, or a wedge shape. The shielding pattern 180b is formed inside the base layer 180a so that the area of the shielding pattern 180b close to the organic light emitting panel 100 is larger than the area of the shielding pattern 180b far away from the organic light emitting panel 100.

The shielding pattern 180b may be opaque. In particular, a color of the shielding pattern 180b may be black. The shielding pattern 180b may include carbon black, carbon nano tube, silicon oxide, or silicon nitride. Therefore, the shielding pattern 180b may have light absorbing properties or light shielding properties. The shielding pattern 180b may further include a metal powder. When the shielding pattern 180b includes a metal powder, the shielding pattern 180b can have an electromagnetic interference shielding function.

Accordingly, when light entering from the outside is incident on the organic light emitting device, a portion of the incident light is absorbed in the shielding pattern 180b of the polarizing film 180 or is reflected by the shielding pattern 180b. The remaining portion of the incident light is polarized by the base layer 180a of the polarizing film 180 and then is incident on the retarder 175.

The retarder 175 retards the light incident on the retarder 175 by a quarter wavelength, and changes linearly polarized light to circular polarized light because a c enter axis of the retarder 175 makes 45 angle with a center axis of the polarizer 170.

Next, the portion of light passing through the retarder 175 is incident on the organic light emitting panel 100, and then is absorbed or diffuse-reflected. The remaining portion of light passes through the retarder 175, and then is retarded by a half wavelength. Accordingly, the reflected light again passing through the retarder 175 makes a right angle with external light, that is not incident on the organic light emitting device, and then disappears.

As described above, the organic light emitting device according to an exemplary embodiment efficiently absorbs and shields incident light entering from the outside due to the shielding patterns 180b and the retarder 175 positioned in the non-emitting area N without reducing an aperture ratio, thereby increasing a contrast ratio and improving the image quality of the organic light emitting device.

Mode for the Invention

Figure 3A:
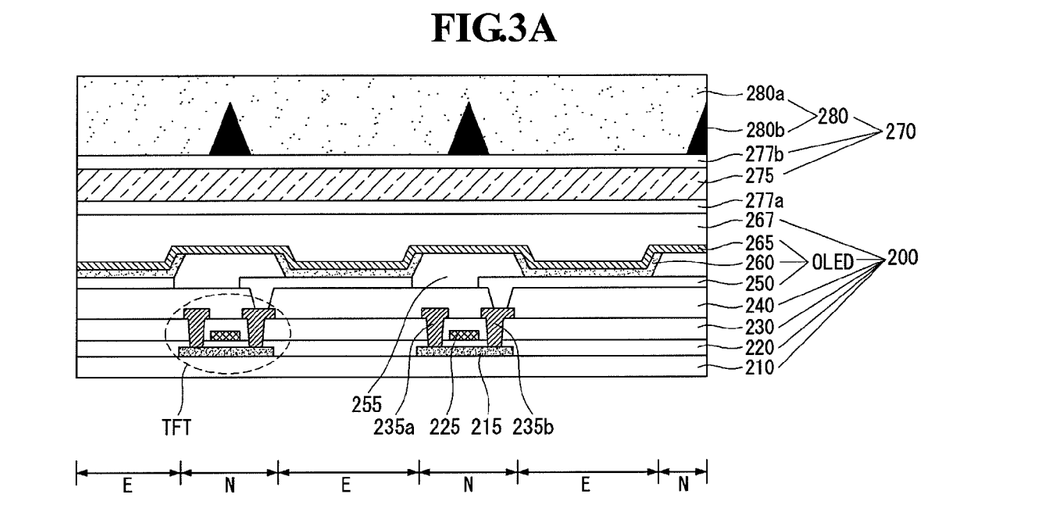
FIGS. 3 and 4 are enlarged views of a portion Z of FIG. 1 in an organic light emitting device according to another exemplary embodiment.
Figure 3B:
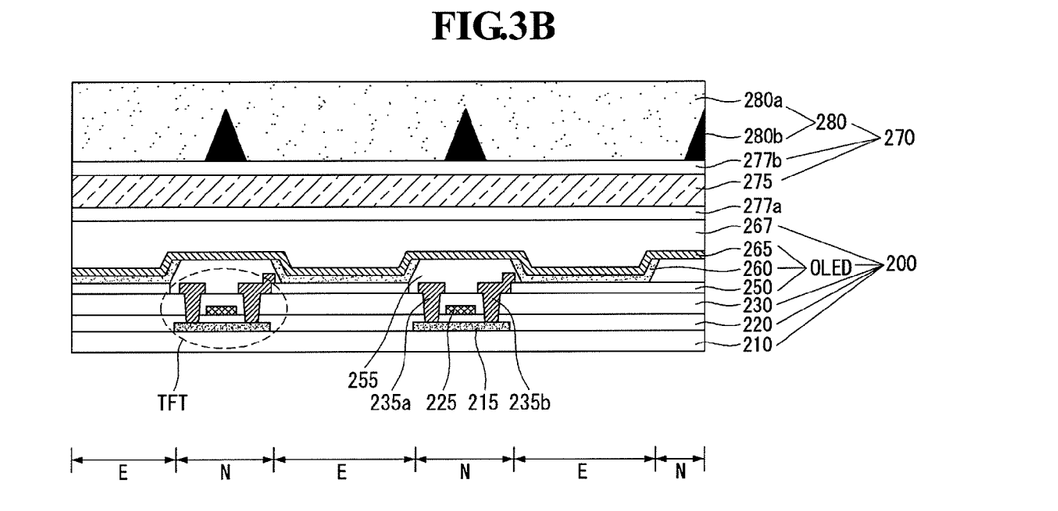
Figure 4:
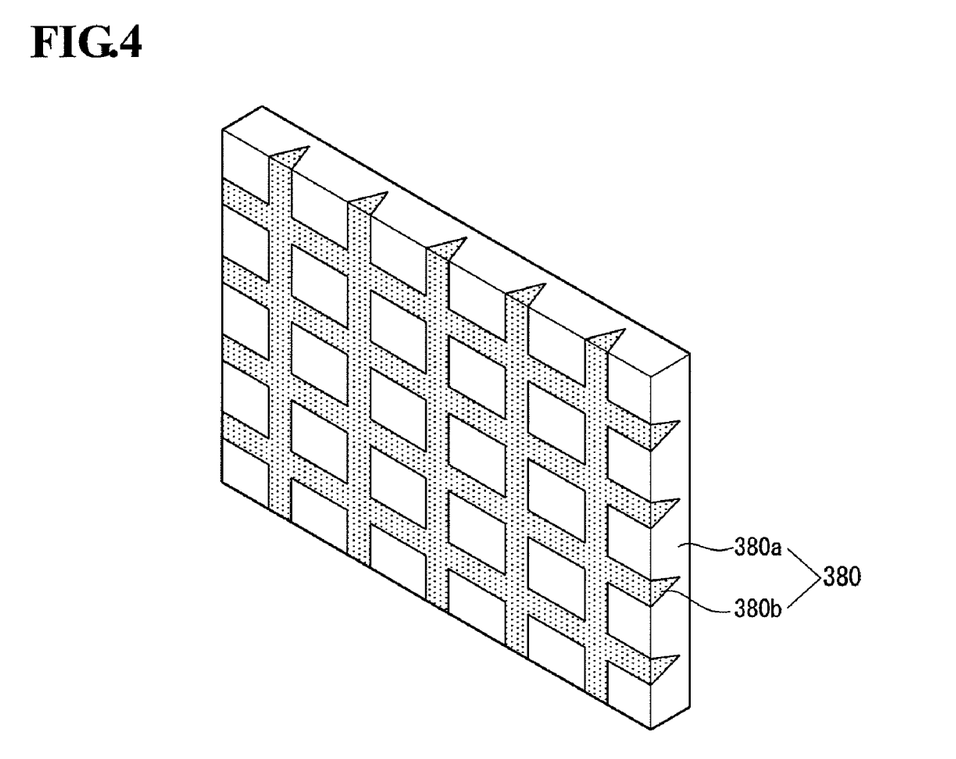

FIGS. 3 and 4 are enlarged views of a portion Z of FIG. 1 in an organic light emitting device according to another exemplary embodiment.

As illustrated in FIGS. 3 and 4, a thin film transistor (TFT) and an organic light emitting diode (OLED) electrically connected to the thin film transistor (TFT) are positioned on a substrate 210.

More specifically, a semiconductor layer 215 is positioned on the substrate 210. The semiconductor layer 215 may include amorphous silicon or polycrystalline silicon. A first insulating layer 220 which is a gate insulating layer is positioned on the semi-conductor layer 215, and a gate electrode 225 is positioned on the first insulating layer 220 to correspond to the semiconductor layer 215.

A second insulating layer 230 is positioned on the gate electrode 225. A source electrode 235a and a drain electrode 235b are positioned on the second insulating layer 230, and electrically connected to the semiconductor layer 215 through the second insulating layer 230 and the first insulating layer 220.

A third insulating layer 240 is positioned on the source electrode 235a and the drain electrode 235b. The third insulating layer 240 may include an organic material such as polyimide and polyacryl-based resin, silicon oxide, or silicon nitride.

A first electrode 250 is positioned on the third insulating layer 240. The first electrode 250 may be electrically connected to the drain electrode 235b through the third insulating layer 240. The first electrode 250 may be an anode electrode. The first electrode 250 may include a reflection metal layer and a transparent conductive layer having a high work function.

A bank layer 255 is positioned on the first electrode 250. The bank layer 255 provides electrical insulation between the first electrodes 250, and exposes a portion of the first electrode 250.

An organic emissive layer 260 is positioned on the exposed first electrode 250. Although it is not shown, a hole transporting layer and a hole injecting layer may be positioned between the first electrode 250 and the organic emissive layer 260. Furthermore, an electron injecting layer and an electron transporting layer may be positioned between the organic emissive layer 260 and a second electrode 265.

The second electrode 265 is positioned on the organic emissive layer 260. The second electrode 265 may be a transmissive electrode, and include a material having a low work function such as aluminium (Al), magnesium (Mg) and silver (Ag).

Accordingly, the organic emissive layer 260 receives holes from the first electrodes 250 and electrons from the second electrode 265 to form excitons. Then, the organic emissive layer 260 displays an image due to light generated when the exciton returns to a ground level. Light emitted from the organic emissive layer 260 is reflected by the first electrodes 250, transmitted through the second electrode 265, and is emitted to the outside. In other words, the organic light emitting device according to an exemplary embodiment is a top emissive type organic light emitting device.

Thin film transistor (TFT) of FIG. 3 includes a semiconductor layer 215, a first insulating layer 220, a gate electrode 225, a second insulating layer 230, a source electrode 235a, a drain electrode 235b, and a third insulating layer 240. Although the explanation was given of an example where the first electrode 250 is formed on the third insulating layer 240 in an exemplary embodiment, an exemplary embodiment is not limited thereto. For instance, as illustrated in FIG. 4, the first electrode 250 may be formed on the second insulating layer 230 to be electrically connected to the drain electrode 235b.

A passivation layer 267 is positioned on the substrate 210 on which the thin film transistor (TFT) and the organic light emitting diode (OLED) are positioned. The passivation layer 267 may be formed in the form of film or encapsulation substrate. The passivation layer 267 may include a transparent material to transmit light generated by the organic emissive layer 260.

A polarizer 270 is positioned on a rear surface of the passivation layer 267. The polarizer 270 may include a retarder 275 and a polarizing film 280 including a base layer 280a and shielding patterns 280b.

The retarder 275 may be a quarter-wave plate. The retarder 275 retards a phase of a light wave entering from the outside or a phase of a light wave emitted from an organic light emitting panel 200 by a quarter wavelength.

The base layer 280a of the polarizing film 280 may include iodine-based material or dye-based material. A maximum polarization efficient value of the base layer 280a can be adjusted to a wavelength corresponding to a maximum value in a luminosity curve of the organic light emitting panel 200 or a wavelength corresponding to a maximum intensity of external light wave.

The shielding patterns 280b are positioned inside the base layer 280a. The shielding pattern 280b may be positioned in the non-emitting area N. In other words, the shielding patterns 280b may be positioned at a location corresponding to the bank layer 255, the thin film transistor (TFT) or the contact hole 245. Although it is not shown, another thin film transistor or capacitors in addition to the thin film transistor (TFT) illustrated in FIG. 3 may be positioned in the non-emitting area N.

Examples of a formation material of the shielding pattern 280b may include carbon black, carbon nano tube, silicon oxide or silicon nitride. The shielding pattern 280b may further include a metal powder. When the shielding pattern 280b includes a metal powder, the shielding pattern 280b can have an electromagnetic interference shielding function.

An area of a lower portion of the shielding pattern 280b may be different from an area of an upper portion of the shielding pattern 280b. For instance, the shielding pattern 280b may have a horn shape such as a cone, a quadrangular pyramid and a triangular pyramid, a prism shape such as a cylinder and a rectangular prism, or a wedge shape. The shielding pattern 280b is formed inside the base layer 280a so that the area of the shielding pattern 280b close to the organic light emitting panel 200 is larger than the area of the shielding pattern 280b far away from the organic light emitting panel 200.

Accordingly, the organic light emitting device according to an exemplary embodiment efficiently absorbs and shields incident light entering from the outside due to the shielding patterns 280b and the retarder 275 positioned in the non-emitting area N without reducing an aperture ratio, thereby increasing a contrast ratio and improving the image quality.

Figure 5:
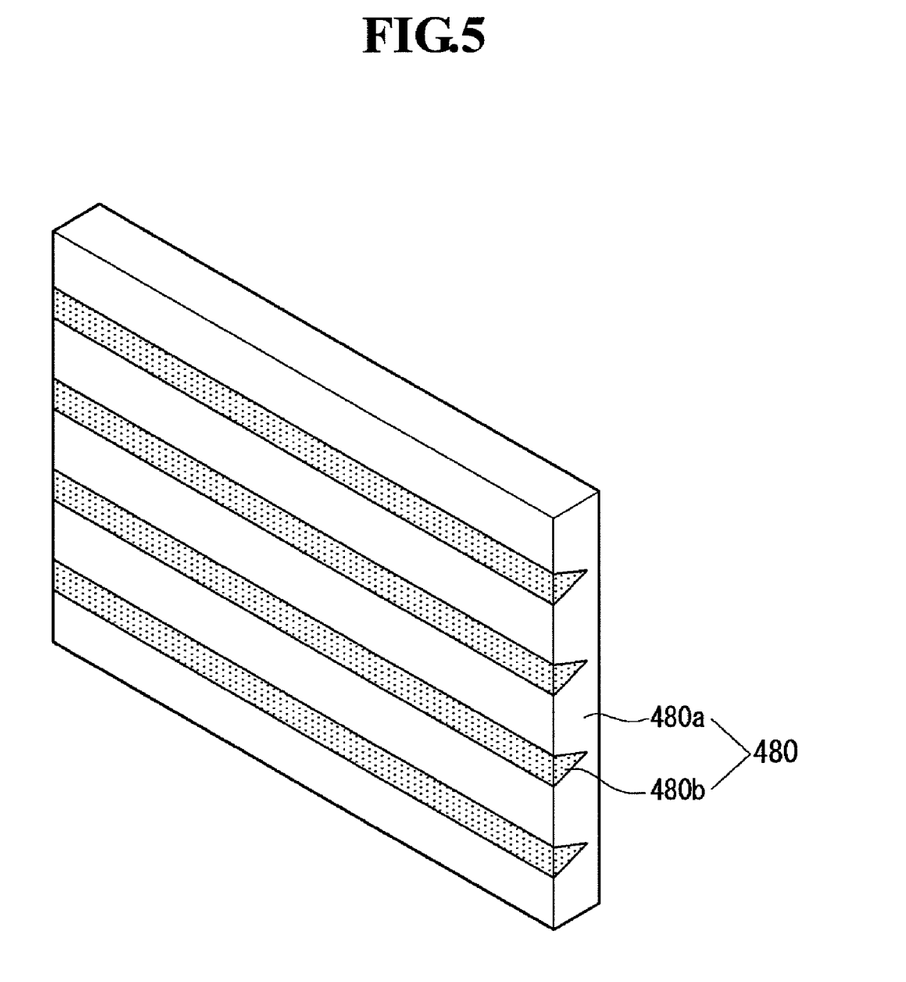
FIGS. 5 to 7 are perspective views of a polarizing film according to an exemplary embodiment.
Figure 6:
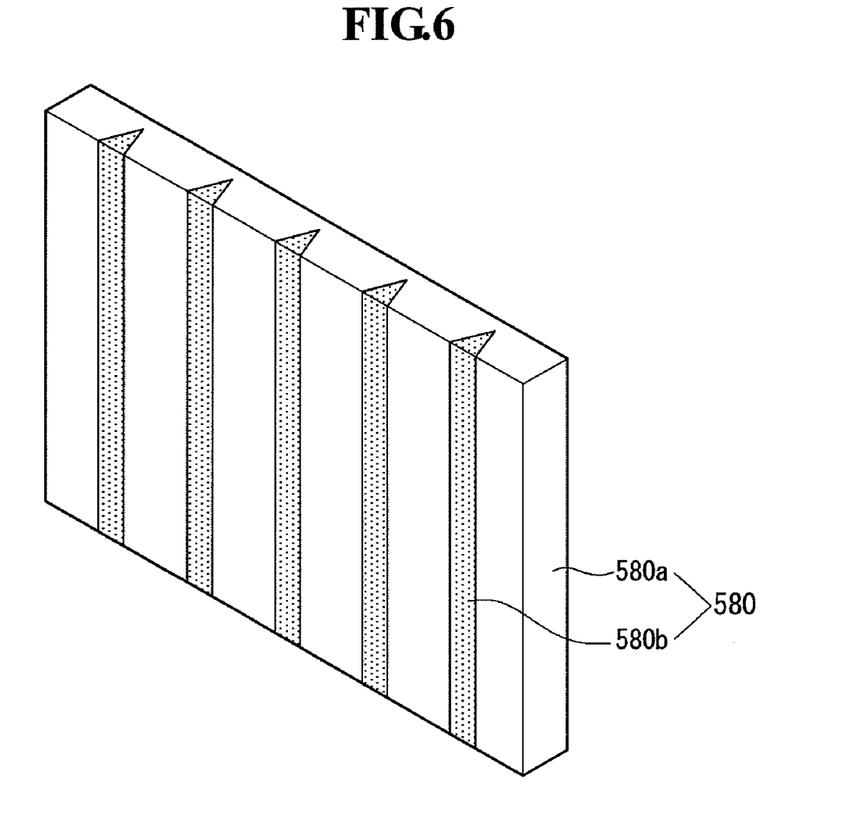
Figure 7:
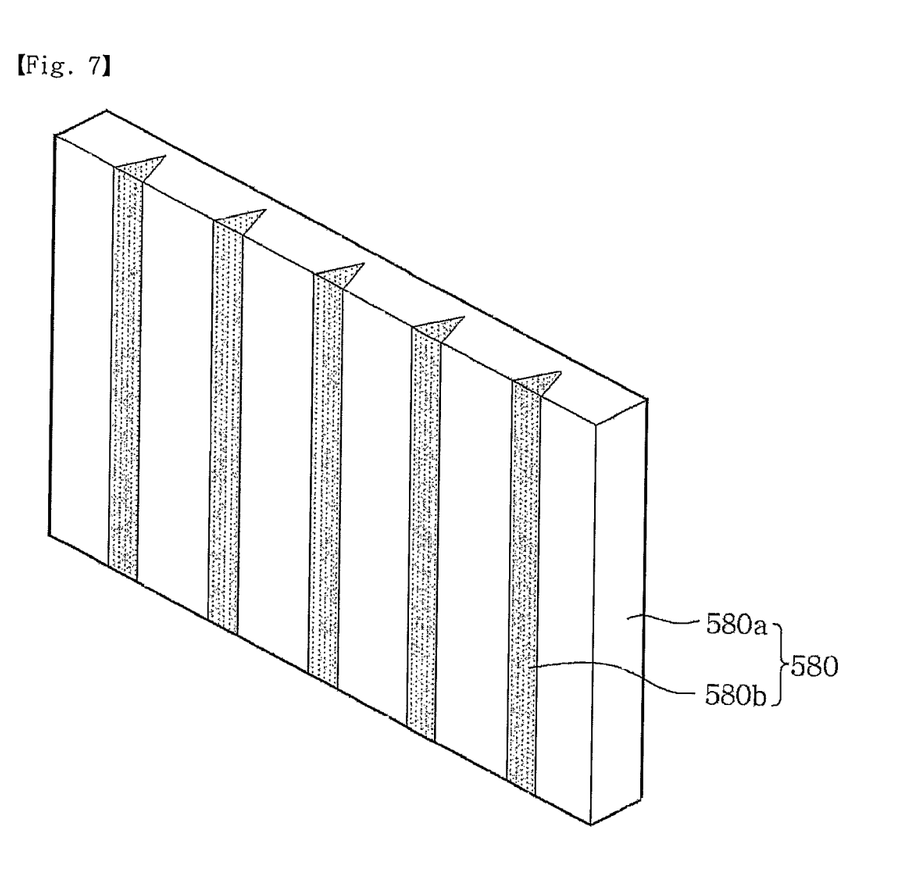

FIGS. 5 to 7 are perspective views of a polarizing film according to an exemplary embodiment.

As illustrated in FIG. 5, a polarizing film 380 includes a base layer 380a and a shielding pattern 380b. The shielding pattern 380b may have a lattice form crossing patterns arranged in a longitudinal direction with patterns arranged in a transverse direction.

The longitudinal direction may be a direction in which data lines are formed, and the transverse direction may be a direction in which scan lines are formed.

As illustrated in FIGS. 6 and 7, shielding patterns 480b and 580b each may include either patterns arranged in a longitudinal direction or patterns arranged in a transverse direction. In this case, it is not necessary that a center axis of each of the shielding patterns 480b and 580b makes a right angle with a base layer of each of the shielding patterns 480b and 580b. In some cases, the center axis of each of the shielding patterns 480b and 580b may be inclined to the base layer of each of the shielding patterns 480b and 580b.

Figure 8:
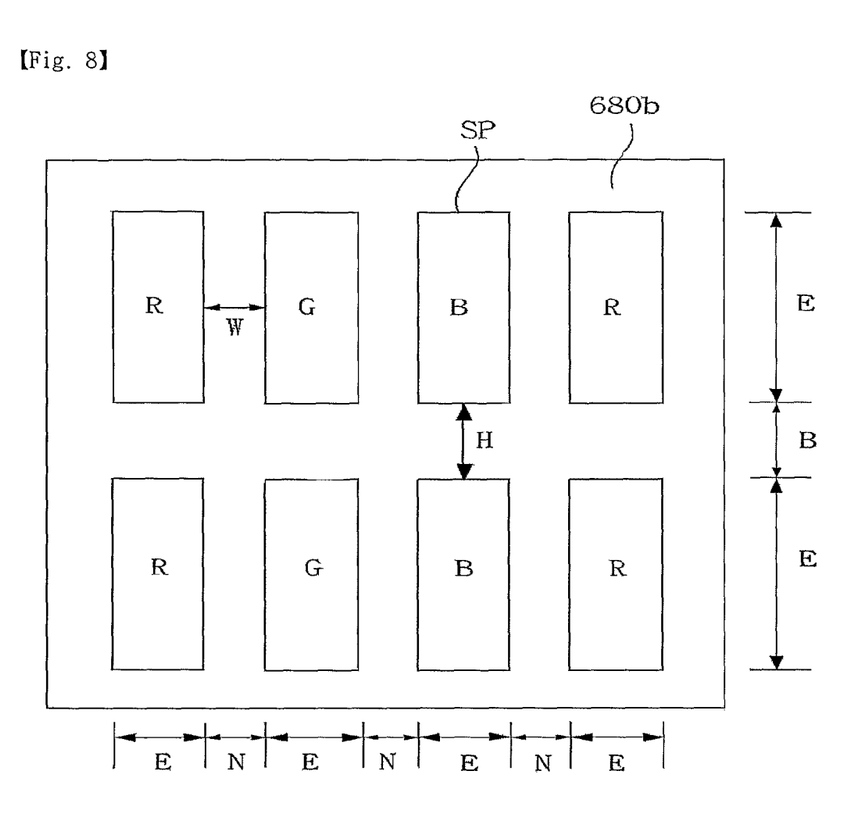
FIG. 8 is a plane view of an organic light emitting device according to an exemplary embodiment.

FIG. 8 is a plane view of an organic light emitting device according to an exemplary embodiment.

As illustrated in FIG. 7, an organic light emitting device according to an exemplary embodiment includes an emitting area E and a non-emitting area N. The emitting area E, as illustrated in FIGS. 2 and 3, may be defined by a bank layer in a subpixel SP.

A shielding pattern 680b may be formed in the non-emitting area N. A width W of the shielding pattern 680b in a transverse direction may range from 10 μm to 30 μm. Generally, an organic emissive layer of the subpixel SP is formed through a vacuum deposition method using a shadow mask. To form the organic emissive layer in each subpixel SP using the shadow mask, a distance between the emitting areas E in a transverse direction (i.e., the width W of the shielding pattern 680b in the transverse direction) may be equal to or more than 10 μm. When the width W of the shielding pattern 680b in the transverse direction is equal to or less than 30 μm, resolution increases.

A width H of the shielding pattern 680b in a longitudinal direction may range from 50 μm to 65 μm. In the case of an active matrix type organic light emitting device, the subpixel SP includes at least two thin film transistors and capacitors for driving an organic light emitting diode. In the case where the active matrix type organic light emitting device is a bottom emissive type device, light produced by the organic light emitting diode is not emitted to the outside of a substrate in a formation area of the thin film transistor and the capacitor in the subpixel SP. Accordingly, when a distance between the emitting areas E in a longitudinal direction (i.e., the width H of the shielding pattern 680*b* in the longitudinal direction) is equal to or more than 50 μm, a formation area of a thin film transistor and a capacitor is secured. When the width H is equal to or less than 60 μm, resolution increases.

The width H of the shielding pattern 680*b* in the longitudinal direction may range from 20 μm to 40 μm. In the case of a passive matrix type organic light emitting device, because the subpixel SP does not include a thin film transistor for driving an organic light emitting diode, an emitting area increases. In the case where an active matrix type organic light emitting device is a top emissive type device, light produced by the organic light emitting diode is emitted to not a rear surface of a substrate but a front surface of the substrate. Therefore, although the top emissive type organic light emitting device includes two thin film transistors and capacitors, the top emissive type organic light emitting device has a larger emitting area than the bottom emissive type organic light emitting device. Accordingly, when the width H of the shielding pattern 680*b* in the longitudinal direction is equal to or more than 20 μm, an emissive layer can be formed in each subpixel. When the width H is equal to or less than 40 μm, resolution increases.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

As described above, since the organic light emitting device according to an exemplary embodiment includes the shielding patterns, light entering from the outside is shielded and the contrast ration increases. External light incident on the organic light emitting device is disappeared such that the image quality is improved. So the organic light emitting device to an exemplary embodiment has industrial applicability.

The invention claimed is:

1. An organic light emitting device comprising:
a display panel; and
a polarizer that is positioned on the display panel and includes a retarder and a polarizing film, the polarizing film including a base layer and shielding patterns positioned inside the base layer, a cross sectional area of the shielding pattern close to the display panel getting larger than a cross sectional area of the shielding pattern far away from the display panel, the shielding pattern being formed in a non-emitting area of the display panel.

2. The organic light emitting device of claim 1, wherein the display panel includes a plurality of subpixels in a crossing area of a scan line and a data line.

3. The organic light emitting device of claim 2, wherein the subpixel includes a first electrode, a bank layer positioned on the first electrode to expose a portion of the first electrode, an organic emissive layer positioned on the exposed first electrode, and a second electrode positioned on the organic emissive layer.

4. The organic light emitting device of claim 3, wherein the shielding pattern is formed at a location corresponding to the bank layer.

5. The organic light emitting device of claim 3, wherein the subpixel includes a thin film transistor or a capacitor.

6. The organic light emitting device of claim 4, wherein the thin film transistor or the capacitor is formed under the bank layer.

7. The organic light emitting device of claim 1, wherein the retarder is a quarter-wave plate.

8. The organic light emitting device of claim 1, wherein the base layer includes iodine-based material or dye-based material, and
the base layer is formed by stretching iodine-based material or dye-based material and then aligning the stretched iodine-based material or dye-based material in one direction.

9. The organic light emitting device of claim 1, wherein the shielding pattern has a horn shape, a prism shape or a wedge shape.

10. The organic light emitting device of claim 2, wherein the shielding pattern is a stripe-shaped pattern arranged in a formation direction of the scan line or the data line.

11. The organic light emitting device of claim 2, wherein the shielding pattern is a mesh-shaped pattern arranged in a formation direction of the scan line and the data line.

12. The organic light emitting device of claim 10, wherein a width of the shielding pattern arranged in the formation direction of the scan line ranges from about 10 μm to about 30 μm.

13. The organic light emitting device of claim 10, wherein a width of the shielding pattern arranged in the formation direction of the data line ranges from about 50 μm to about 65 μm.

14. The organic light emitting device of claim 10, wherein a width of the shielding pattern arranged in the formation direction of the data line ranges from about 20 μm to about 40 μm.

15. The organic light emitting device of claim 1, wherein the shielding pattern is opaque.

16. The organic light emitting device of claim 15, wherein a color of the shielding pattern is black.

17. The organic light emitting device of claim 1, wherein the shielding pattern has light absorbing properties or light shielding properties.

18. The organic light emitting device of claim 1, wherein the shielding pattern includes carbon.

* * * * *